United States Patent
Guo

(10) Patent No.: US 9,229,513 B2
(45) Date of Patent: Jan. 5, 2016

(54) BATTERY CAPACITY DISPLAYING SYSTEM FOR WIRELESS PERIPHERAL DEVICE

(71) Applicant: Primax Electronics Ltd., Neihu, Taipei (TW)

(72) Inventor: Jing-Ing Guo, Taipei (TW)

(73) Assignee: PRIMAX ELECTRONICS LTD., Taipei (TW)

( * ) Notice: Subject to any disclaimer, the term of this patent is extended or adjusted under 35 U.S.C. 154(b) by 79 days.

(21) Appl. No.: 14/084,291

(22) Filed: Nov. 19, 2013

(65) Prior Publication Data

US 2015/0077123 A1  Mar. 19, 2015

(30) Foreign Application Priority Data

Sep. 13, 2013 (TW) .............................. 102133272 A

(51) Int. Cl.
| | |
|---|---|
| *H02J 7/00* | (2006.01) |
| *G06F 1/26* | (2006.01) |
| *G06F 1/32* | (2006.01) |
| *G06F 3/023* | (2006.01) |
| *G06F 3/0354* | (2013.01) |
| *G01R 31/36* | (2006.01) |

(52) U.S. Cl.
CPC .............. *G06F 1/266* (2013.01); *G06F 1/3215* (2013.01); *G06F 3/0231* (2013.01); *G06F 3/03543* (2013.01); *G01R 31/3689* (2013.01)

(58) Field of Classification Search
CPC ....................................................... H02J 7/0027
USPC ......................................................... 320/132
See application file for complete search history.

(56) References Cited

U.S. PATENT DOCUMENTS 8,990,038 B2 * 3/2015 Staton et al. .................... 702/63

FOREIGN PATENT DOCUMENTS

JP  06-245281 A * 9/1994 ............... H04Q 9/00

* cited by examiner

*Primary Examiner* — Edward Tso
*Assistant Examiner* — Ahmed Omar
(74) *Attorney, Agent, or Firm* — Konkie McConkie; Evan R. Witt

(57) ABSTRACT

A battery capacity displaying system includes a host, a display device in communication with the host, and a wireless peripheral device. The display device is connected with the host. The display device is in communication with the host, and includes a triggering element. When the triggering element is pressed, a wireless signal containing a battery capacity data is transmitted from the wireless peripheral device to the host. After the wireless signal is received by the host, a residual battery capacity corresponding to the battery capacity data is displayed on the display device. Consequently, the user can realize the residual battery capacity of the wireless peripheral device at any appropriate time according to the practical requirements.

9 Claims, 5 Drawing Sheets

BATTERY CAPACITY DISPLAYING SYSTEM FOR WIRELESS PERIPHERAL DEVICE

FIELD OF THE INVENTION

The present invention relates to a battery capacity displaying system, and more particularly to a battery capacity displaying system for a wireless peripheral device.

BACKGROUND OF THE INVENTION

Nowadays, computers are widely used and become essential parts in our daily lives. In addition to the working purposes, computers may be employed as amusement tools. With increasing development of computers, computer peripheral devices make great progress. The computer peripheral devices comprise various input devices such as keyboard devices, mouse devices or touchpads. Conventionally, the computer peripheral device is in communication with the computer by using a physical connecting wire as a connecting medium. In recent years, the computer peripheral device is in communication with the computer by using a wireless signal as the connecting medium. Since the wireless peripheral device is no longer equipped with the physical connecting wire, the wireless peripheral device can be used and carried more conveniently.

Although the wireless peripheral device without the physical connecting wire has the above benefits, the wireless peripheral device still has some drawbacks. For example, the wired peripheral device can acquire stable electric power from the computer system through the physical connecting wire, but the wireless peripheral device fails to acquire stable electric power from the computer system. For providing stable electric power, the wireless peripheral device has to be additionally equipped with a battery.

Since the electric power stored in the battery may be used up, the user has to frequently pay attention to the battery capacity of the wireless peripheral device. Before the battery capacity is used up, the battery may be replaced with a new one or the battery may be charged by a charger. However, most users may often ignore the battery capacity. Consequently, when the battery capacity is used up, the user may usually find that no available new battery is acquired or no charger is available to charge the battery. Under this circumstance, the wireless peripheral device cannot be used.

For solving the above drawbacks, a wireless induction system and a battery capacity reminding method were disclosed in Taiwanese Patent No. I284273, which was entitled "Cordless electromagnetic induction system and method for reminding battery capacity". The wireless induction system disclosed in this patent comprises a wireless pen, a graphics tablet and a host. The wireless pen comprises a battery, a radio frequency oscillator and a battery voltage detector. The graphics tablet comprises a radio frequency receiver. When the battery voltage detector detects that the battery capacity of the wireless pen is lower than a specified value, the radio frequency oscillator issues a radio frequency signal to the radio frequency receiver of the graphics tablet. After the radio frequency signal is received, the graphics tablet will notify the host of issuing a low battery warning signal to remind the user. The low battery warning signal is for example a sound signal, a visible signal, a pop-up window, a flickering signal shown on a display screen, or a light color change.

However, the low battery warning signal may only last for a certain time period (e.g. about 3 to 5 seconds). For example, the pop-up window may last for 5 seconds, and then disappear. When the low battery warning signal generates, the user may leave the host without watching or hearing the low battery warning signal. After the user comes back to operate the host, the low battery warning signal has already disappeared. Under this circumstance, the battery capacity reminding function is lost.

Therefore, there is a need of providing a battery capacity displaying system for a wireless peripheral device in order to assure that the user receives the battery capacity message.

SUMMARY OF THE INVENTION

An object of the present invention provides a battery capacity displaying system for a wireless peripheral device, in which the timing of displaying the battery capacity message is determined according to the user's requirement.

Another object of the present invention provides a battery capacity displaying system for a wireless peripheral device in order to assure that the user receives the battery capacity message.

In accordance with an aspect of the present invention, there is provided a battery capacity displaying system. The battery capacity displaying system includes a host, a display device, and a wireless peripheral device. The display device is connected with the host. The wireless peripheral device is in communication with the host. The wireless peripheral device includes a battery and a triggering element. The battery is disposed within the wireless peripheral device for providing electric power to the wireless peripheral device. The triggering element is disposed on the wireless peripheral device. When the triggering element is pressed, a wireless signal containing a battery capacity data is transmitted from the wireless peripheral device to the host. After the wireless signal is received by the host, a residual battery capacity corresponding to the wireless signal is displayed on the display device.

The above objects and advantages of the present invention will become more readily apparent to those ordinarily skilled in the art after reviewing the following detailed description and accompanying drawings, in which:

DETAILED DESCRIPTION OF THE PREFERRED EMBODIMENT

For eliminating the drawbacks of the conventional technology, the present invention provides a battery capacity displaying system for a wireless peripheral device.

Figure 1:
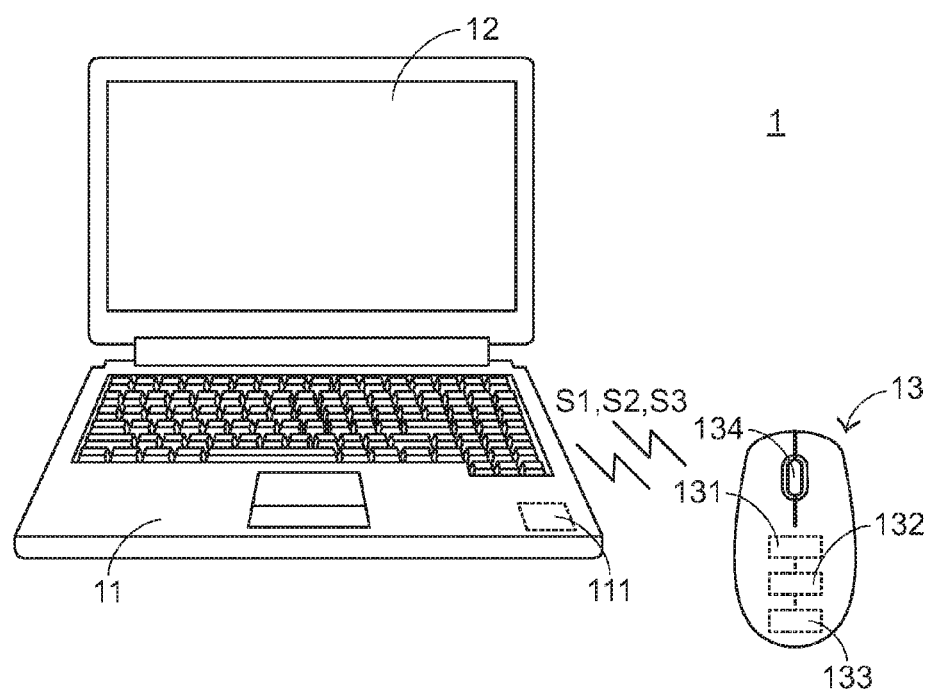
FIG. 1 schematically illustrates the architecture of a battery capacity displaying system for a wireless peripheral device according to a first embodiment of the present invention.

FIG. 1 schematically illustrates the architecture of a battery capacity displaying system for a wireless peripheral device according to a first embodiment of the present invention. As shown in FIG. 1, the battery capacity displaying system 1 comprises a host 11, a display device 12, and a wireless peripheral device 13. The display device 12 is disposed on the host 11. The display device 12 is in communication with the host 11 through built-in connection. The host 11 comprises a second wireless communication module 111. The display device 12 is used for displaying a graphic-based window for the user. In this embodiment, the host 11 is a notebook computer host, the display device 12 is a display screen, and the wireless peripheral device 13 is a wireless mouse device. In another embodiment, the wireless peripheral device is a wireless keyboard device, a wireless digital tablet or a wireless digital pen.

Please refer to FIG. 1 again. The wireless peripheral device 13 is in communication with the second wireless communication module 111 of the host 11. The wireless peripheral device 13 comprises a battery 131, a battery capacity detecting module 132, a first wireless communication module 133, and a triggering element 134. The battery 131 is disposed within the wireless peripheral device 13 for providing electric power to the wireless peripheral device 13, so that the wireless peripheral device 13 can be normally operated. The battery capacity detecting module 132 is disposed within the wireless peripheral device 13 and connected with the battery 131. The first wireless communication module 133 is disposed within the wireless peripheral device 13, and connected with the triggering element 134 and the battery capacity detecting module 132. The triggering element 134 is disposed on the wireless peripheral device 13, and exposed to a top surface of the wireless peripheral device 13. When the triggering element 134 is pressed by the user, a battery capacity displaying function is triggered. In this embodiment, both of the first wireless communication module 133 and the second wireless communication module 111 are Bluetooth communication modules, and the first wireless communication module 133 and the second wireless communication module 111 are in wireless communication with each other by a Bluetooth communication technology. Alternatively, in some other embodiments, the both of the first wireless communication module and the second wireless communication module are infrared communication modules, and the first wireless communication module and the second wireless communication module are in wireless communication with each other by an infrared communication technology. Alternatively, in some other embodiments, the both of the first wireless communication module and the second wireless communication module are near-field communication modules, and the first wireless communication module and the second wireless communication module are in wireless communication with each other by a near-field communication technology.

Hereinafter, the operations of the wireless peripheral device 13 will be illustrated with reference to FIG. 1. During the operations of the wireless peripheral device 13, the battery capacity detecting module 132 within the wireless peripheral device 13 periodically detects the battery 131 every predetermined time interval (e.g. 5 seconds). Consequently, a battery capacity data D about the residual capacity of the battery 131 is acquired. After the battery capacity data D is acquired by the battery capacity detecting module 132, the battery capacity data D is transmitted to the first wireless communication module 133, and the battery capacity data D is stored in the first wireless communication module 133. Of course, the battery capacity data D stored in the first wireless communication module 133 is updated every the predetermined time interval.

In this embodiment, the triggering element 134 is a wheel button of a wireless mouse device. When the wheel button is pressed down, a button function is generated. That is, the wireless peripheral device 13 of this embodiment uses the seldom-used button as the triggering element 134. Alternatively, in another embodiment, a single physical button is additionally installed on a surface of the wireless peripheral device to be used as the triggering element. Alternatively, in a further embodiment, the function of the triggering element is achieved by pressing any two buttons (e.g. the left button and the right button, or the right button and the wheel button) of the wireless mouse. Alternatively, in some other embodiments, the function of the triggering element may be achieved by using a sound-activated control module, a vibration sensing element (e.g. a gyroscope) for detecting whether the wireless peripheral device is rocked, or a sensing element for detecting a motion of the user (e.g. the eyes' rotation or the hand gesture of the user).

Figure 2:
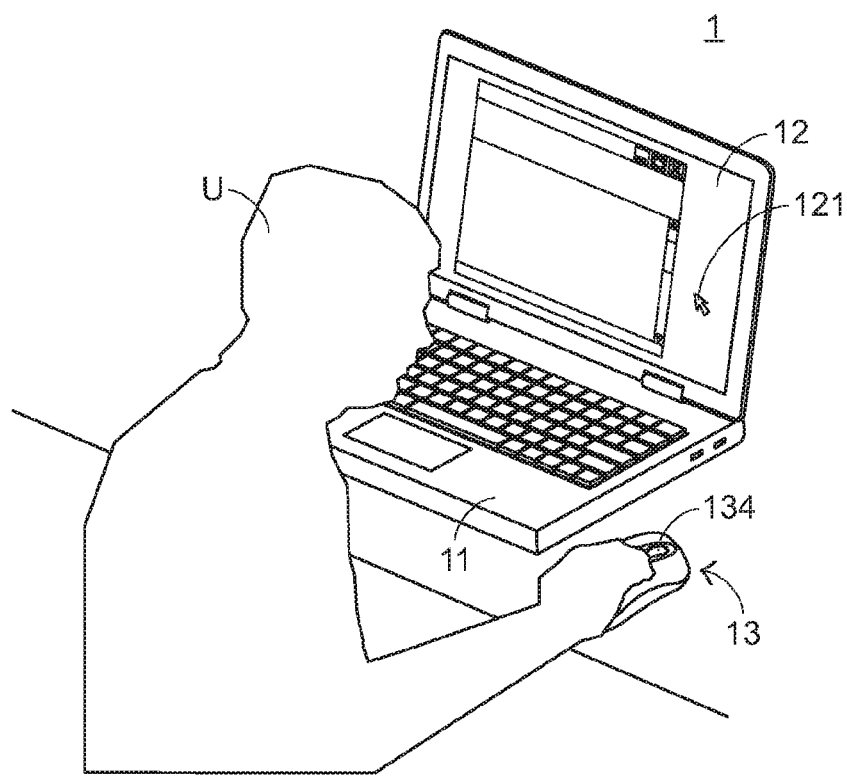
FIG. 2 schematically illustrates the operations of the battery capacity displaying system according to the first embodiment of the present invention.

Hereinafter, the operations of the battery capacity displaying system 1 of the present invention will be illustrated with reference to FIGS. 1 and 2. FIG. 2 schematically illustrates the operations of the battery capacity displaying system according to the first embodiment of the present invention. As shown in FIG. 2, the wireless peripheral device 13 is operated by a user U in order to control the host 11. In addition, a cursor 121 is shown on the display device 12. By operating the wireless peripheral device 13, the cursor 121 is correspondingly moved. For example, when the wireless peripheral device 13 is moved in a left direction by the user U, a first wireless signal S1 containing a left moving command is transmitted from the first wireless communication module 133 to the second wireless communication module 111. After the first wireless signal S1 is received by the second wireless communication module 111, the cursor 121 is moved in the left direction by the host 11 according to the first wireless signal S1.

Figure 3:
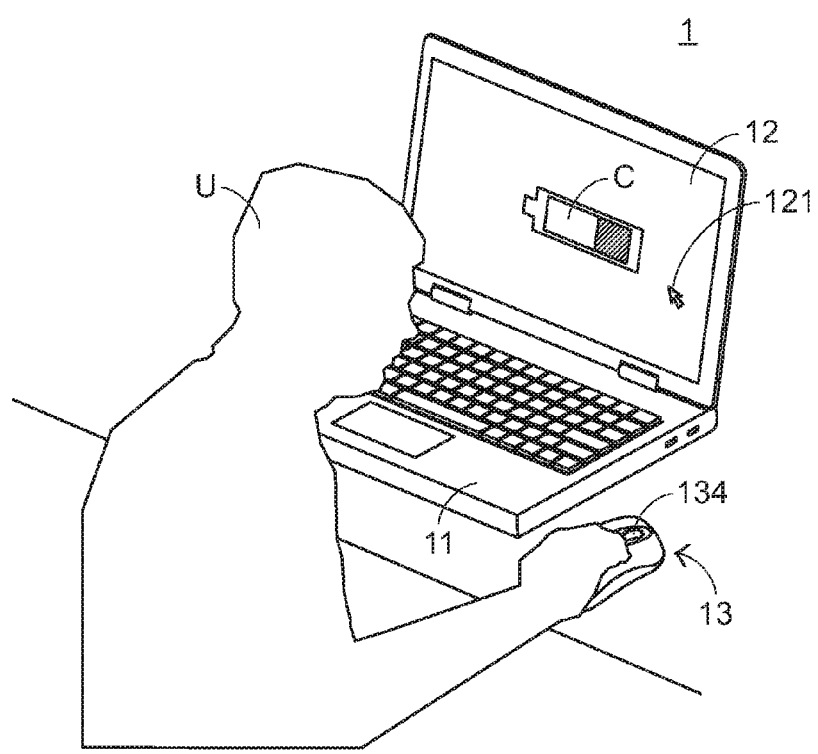
FIG. 3 schematically illustrates a residual battery capacity displayed on the display device of the battery capacity displaying system according to the first embodiment of the present invention.

When the user U wants to realize the residual battery capacity of the battery 131 of the wireless peripheral device 13, the user U may press the triggering element 134. After the triggering element 134 is pressed, a second wireless signal S2 is transmitted from the first wireless communication module 133 to the second wireless communication module 111 of the host 11. The second wireless signal S2 contains the newly-updated battery capacity data D. After the second wireless signal S2 is received by the second wireless communication module 111, the battery capacity data D is acquired by the host 11 according to the second wireless signal S2, and the display device 12 is controlled by the host 11 to display a residual battery capacity C corresponding to the battery capacity data D of the second wireless signal S2. FIG. 3 schematically illustrates a residual battery capacity displayed on the display device of the battery capacity displaying system according to the first embodiment of the present invention. As shown in FIG. 3, the residual battery capacity C is displayed as a battery bar image on the display device 12 in a full-page displaying manner. In addition, the residual battery capacity C is continuously displayed.

After the user U realizes the capacity of the battery 131 by viewing the residual battery capacity C, the user U may operate the wireless peripheral device 13 to allow the wireless peripheral device 13 to output a third wireless signal S3 to the host 11. In response to the third wireless signal S3, the display device 12 is controlled by the host 11 to stop displaying the residual battery capacity C. In this embodiment, the third wireless signal S3 is generated by operating the wireless peripheral device 13. For example, by moving the wireless peripheral device 13 or pressing any key of the wireless peripheral device 13, the third wireless signal S3 is generated. That is, before the wireless peripheral device 13 is operated, the residual battery capacity C is continuously displayed so as to assure that the user U can view the residual battery capacity C.

From the above discussions about the battery capacity displaying system 1, when the triggering element 134 is pressed, the second wireless signal S2 containing the battery capacity data D is transmitted from the wireless peripheral device 13 to the host 11. According to the second wireless signal S2, the residual battery capacity C is displayed on the display device 12. Consequently, the user U can realize the capacity of the battery 131 at any appropriate time according to the practical requirements. Moreover, since the residual battery capacity C disappears after the wireless peripheral device 13 is operated, the residual battery capacity C displayed on the display device 12 can be certainly viewed by the user U.

Figure 4:
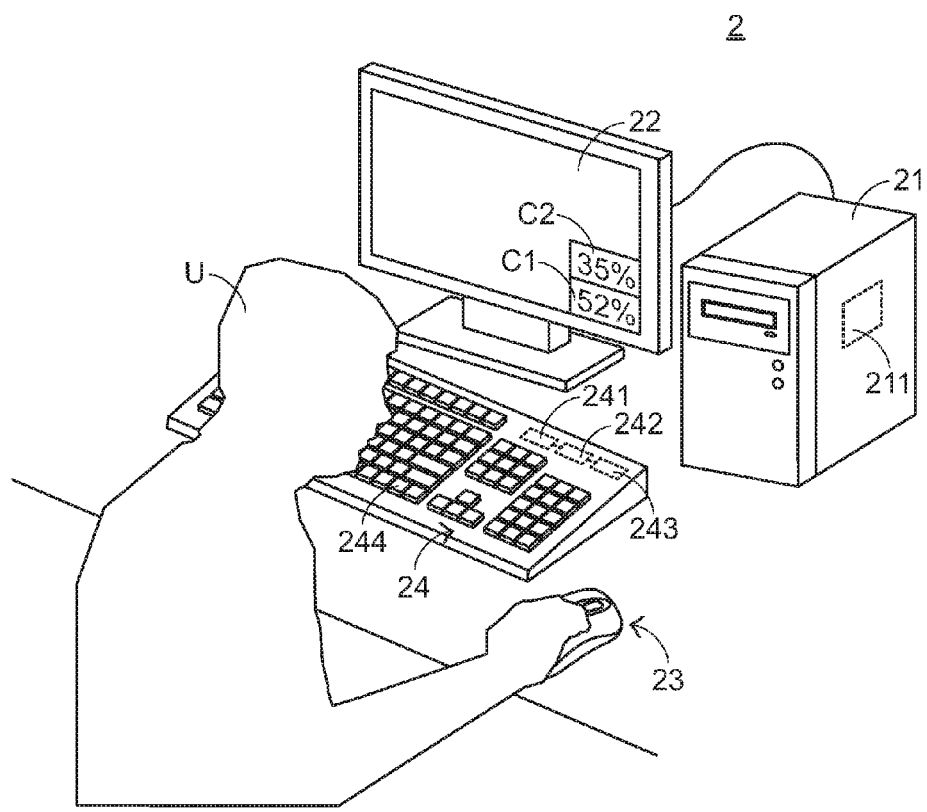
FIG. 4 schematically illustrates the operations of a battery capacity displaying system for a wireless peripheral device according to a second embodiment of the present invention.

The present invention further provides a second embodiment. FIG. 4 schematically illustrates the operations of a battery capacity displaying system for a wireless peripheral device according to a second embodiment of the present invention. As shown in FIG. 4, the battery capacity displaying system 2 comprises a host 21, a display device 22, a first wireless peripheral device 23, and a second wireless peripheral device 24. The host 21 is in communication with the host through external connection. The host 21 comprises a third wireless communication module 211. The display device 22 is used for displaying a first residual battery capacity C1 corresponding to the first wireless peripheral device 23 and a second residual battery capacity C2 corresponding to the second wireless peripheral device 24. That is, the first residual battery capacity C1 and the second residual battery capacity C2 are displayed on the display device 22 so as to be viewed by the user. In this embodiment, the host 21 is a desktop computer host, the display device 22 is a display screen, the first wireless peripheral device 23 is a wireless mouse device, and the second wireless peripheral device 24 is a wireless keyboard device. The operating principles of the first wireless peripheral device 23 are identical to those of the wireless peripheral device 13 of the first embodiment, and are not redundantly herein.

Except for the following four items, the configurations of the capacity displaying system 2 of this embodiment are substantially identical to those of the capacity displaying system 1 of the first embodiment and are not redundantly herein.

Firstly, the second wireless peripheral device 24 comprises a battery 241, a second battery capacity detecting module 242, a second wireless communication module 243, and a second triggering element 244. The functions of these components of the second wireless peripheral device 24 are substantially identical to those of the wireless peripheral device 13 of the first embodiment, and are not redundantly herein. More especially, the second triggering element 244 is composed of plural keys (e.g. the key A and the key S) of the wireless keyboard device. When the key A is pressed by the user U, a first key signal corresponding to the input of the letter A is generated by the key A. Similarly, when the key S is pressed by the user U, a first key signal corresponding to the input of the letter S is generated by the key S. When the key A and the key S are sequentially depressed in a short time (e.g. 1 second), plural first key signals corresponding to the inputs of the key A and the key S are collaboratively constituted as a wireless signal of the second triggering element 244. In response to the wireless signal, the display device 22 is controlled by the host 21 to display the second residual battery capacity C2. It is noted that numerous modifications and alterations may be made while retaining the teachings of the invention. For example, in another embodiment, the wireless signal is generated when the key A and the key B are simultaneously pressed by the user U, and the second residual battery capacity is displayed in response to the wireless signal.

Secondly, all of the first wireless communication module (not shown), the second wireless communication module 243 and the third wireless communication module 211 in this embodiment are infrared communication modules.

Thirdly, the first residual battery capacity C1 and the second residual battery capacity C2 of this embodiment are displayed on a lower right corner of the display device 22 as a small message box, and the first residual battery capacity C1 and the second residual battery capacity C2 are expressed as residual percentages (see FIG. 4).

Fourthly, after the first residual battery capacity C1 is displayed, the user U may operate the first wireless peripheral device 23 to stop displaying the first residual battery capacity C1, and/or the user U may operate the second triggering element 244 to stop displaying the first residual battery capacity C1. The way of stopping displaying the second residual battery capacity C2 is similar. That is, the user U may operate any one of the first wireless peripheral device 23 and the second triggering element 244 to stop displaying the first residual battery capacity C1 and the second residual battery capacity C2.

Figure 5:
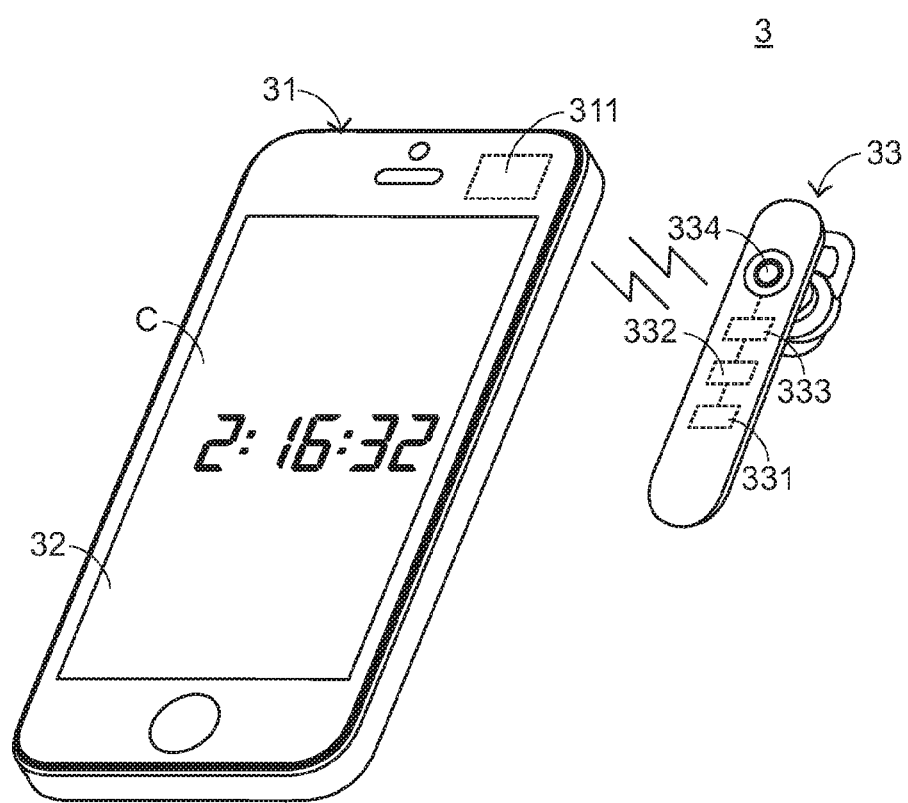
FIG. 5 schematically illustrates the architecture of a battery capacity displaying system for a wireless peripheral device according to a third embodiment of the present invention.

The present invention further provides a third embodiment. FIG. 5 schematically illustrates the architecture of a battery capacity displaying system for a wireless peripheral device according to a third embodiment of the present invention. As shown in FIG. 5, the battery capacity displaying system 3 comprises a host 31, a display device 32, and a wireless peripheral device 33. The display device 32 is disposed on the host 31. The display device 32 is in communication with the host 31 through built-in connection. The host 31 comprises a second wireless communication module 311. The display device 32 is used for displaying a residual battery capacity C to be viewed by the user. In this embodiment, the host 31 is a smart phone, the display device 32 is a touch screen of the smart phone, and the wireless peripheral device 33 is a wireless earphone. Alternatively, in another embodiment, the host is a tablet computer or a personal digital assistant (PDA).

The wireless peripheral device 33 comprises a battery 331, a battery capacity detecting module 332, a first wireless communication module 333, and a triggering element 334. The operating principles of the first wireless peripheral device 33 are identical to those of the wireless peripheral device 13 of the first embodiment, and are not redundantly herein.

Except for the following two items, the configurations of the capacity displaying system 3 of this embodiment are substantially identical to those of the capacity displaying system 1 of the first embodiment and are not redundantly herein. Firstly, the triggering element 334 is a single physical button or a single physical key that is additionally installed on the first wireless peripheral device 33. Moreover, when the triggering element 334 is pressed by the user, only the function of generating the wireless signal containing the battery capacity data D is triggered, but no other function is implemented. Secondly, the residual battery capacity C is displayed on the display device 32 as a usable time in a full-page displaying manner (see FIG. 5). The usable time is determined according to the capacity of the battery 331 and the average loss rate of the battery 331.

From the above description, the present invention provides a battery capacity displaying system for a wireless peripheral device. By pressing the triggering element, the wireless signal containing the battery capacity data is transmitted from the wireless peripheral device to the host. Consequently, the residual battery capacity is displayed on the display device in order to be viewed by the user. Moreover, until the wireless peripheral device is operated by the user to generate an operating signal, the residual battery capacity is no longer displayed. That is, before the wireless peripheral device is operated, the residual battery capacity is continuously displayed so as to assure that the residual battery capacity displayed on the display device can be viewed by the user.

In comparison with the conventional technology, the battery capacity displaying system of the present invention is not restricted to display the residual battery capacity when the residual capacity of the battery is lower than a specified value (e.g. twenty percent of the total capacity). According to the battery capacity displaying system of the present invention, the residual battery capacity displayed when the triggering element is pressed. In addition, the residual battery capacity is continuously displayed until the user stops displaying the residual battery capacity. Consequently, the battery capacity displaying system of the present invention is effective to overcome the drawbacks of the conventional technology.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. A battery capacity displaying system for a wireless peripheral device, the battery capacity displaying system comprising:
    a host
    a display device in communication with the host; and
    the wireless peripheral device in communication with the host, wherein the wireless peripheral device comprises:
        a battery disposed within the wireless peripheral device for providing electric power to the wireless peripheral device; and
        a triggering element disposed on the wireless peripheral device, wherein when the triggering element is pressed, a wireless signal containing a battery capacity data is transmitted from the wireless peripheral device to the host, wherein after the wireless signal is received by the host, a residual battery capacity corresponding to the wireless signal is displayed on the display device;
    wherein when the residual battery capacity corresponding to the wireless signal is displayed on the display device, if another wireless signal from the wireless peripheral device or another wireless peripheral device is received by the host, the host stops displaying the residual battery capacity on the display device.

2. The battery capacity displaying system according to claim 1, wherein the wireless peripheral device further comprises:
    a battery capacity detecting module disposed within the wireless peripheral device and connected with the battery for detecting the battery, thereby acquiring the battery capacity data; and
    a first wireless communication module disposed within the wireless peripheral device, and connected with the triggering element and the battery capacity detecting module for receiving the battery capacity data from the battery capacity detecting module, wherein when the triggering element is pressed, the first wireless communication module issues the wireless signal to a second wireless communication module of the host.

3. The battery capacity displaying system according to claim 2, wherein the first wireless communication module and the second wireless communication module are in communication with each other by a Bluetooth communication technology, an infrared communication technology or a near-field communication technology, wherein the wireless peripheral device is a wireless keyboard device, a wireless mouse device, a wireless digital tablet, a wireless digital pen or a wireless earphone.

4. The battery capacity displaying system according to claim 1, wherein the triggering element is exposed to a surface of the wireless peripheral device, and the triggering element is a single physical button or a single physical key for triggering a single function.

5. The battery capacity displaying system according to claim 1, wherein the triggering element is exposed to a surface of the wireless peripheral device, and the triggering element is composed of plural physical buttons or plural physical keys for triggering plural functions, respectively.

6. The battery capacity displaying system according to claim 5, wherein when each of the plural physical buttons or the plural physical keys is pressed, a first button signal or a first key signal is correspondingly generated, wherein when the plural physical buttons or the plural physical keys are simultaneously or sequentially pressed, the plural first button signals or the plural first key signals generated by the plural physical buttons or the plural physical keys are collaboratively constituted as the wireless signal.

7. The battery capacity displaying system according to claim 1, wherein the display device is in communication with the host through external connection, wherein the display device is a display screen, and the host is a desktop computer host.

8. The battery capacity displaying system according to claim 1, wherein the display device is in communication with the host through built-in connection, wherein the display device is a display screen, and the host is a notebook computer host, a smart phone, a tablet computer or a personal digital assistant (PDA).

9. The battery capacity displaying system according to claim 1, wherein the residual battery capacity is displayed on the display device as a battery bar image, a residual percentage or a usable time in a full-page displaying manner.

* * * * *